US012745491B2

(12) United States Patent
Kageyama

(10) Patent No.: US 12,745,491 B2
(45) Date of Patent: Sep. 22, 2026

(54) METHOD FOR MANUFACTURING LIGHT-EMITTING DEVICE, AND LIGHT-EMITTING DEVICE

(71) Applicant: NICHIA CORPORATION, Anan (JP)

(72) Inventor: Hiroaki Kageyama, Tokushima (JP)

(73) Assignee: NICHIA CORPORATION, Anan (JP)

( * ) Notice: Subject to any disclaimer, the term of this patent is extended or adjusted under 35 U.S.C. 154(b) by 514 days.

(21) Appl. No.: 18/334,773

(22) Filed: Jun. 14, 2023

(65) Prior Publication Data

US 2023/0411569 A1 Dec. 21, 2023

(30) Foreign Application Priority Data

Jun. 15, 2022 (JP) ................................ 2022-096430

(51) Int. Cl.
*H10H 20/01* (2025.01)
*H10H 20/851* (2025.01)
*H10H 20/852* (2025.01)

(52) U.S. Cl.
CPC ........ *H10H 20/8514* (2025.01); *H10H 20/01* (2025.01); *H10H 20/852* (2025.01); *H10H 20/0361* (2025.01); *H10H 20/0362* (2025.01)

(58) Field of Classification Search
CPC .................................................. H10H 20/0361
USPC ............................................................ 438/25
See application file for complete search history.

(56) References Cited

U.S. PATENT DOCUMENTS

2014/0301054 A1 10/2014 Nagai et al.
2015/0108533 A1 4/2015 Fukumitsu et al.
2018/0040780 A1 2/2018 Hirasawa et al.
2018/0175267 A1 6/2018 Hirasawa et al.
2021/0305219 A1* 9/2021 Nishiyama ......... H10H 20/8514

FOREIGN PATENT DOCUMENTS

JP 2000244022 A 9/2000
JP 2001036154 A 2/2001
JP 2012124443 A 6/2012
JP 2012138441 A 7/2012
JP 2013122951 A 6/2013
JP 2016086111 A 5/2016
(Continued)

*Primary Examiner* — Hsin Yi Hsieh

(74) *Attorney, Agent, or Firm* — Hunton Andrews Kurth LLP

(57) ABSTRACT

A method for manufacturing a light-emitting device includes: providing a substrate on which a semiconductor portion is disposed; providing a support substrate having conductivity, including a first surface and a second surface on a side opposite to the first surface, and including a groove portion formed at the first surface; electrically connecting the semiconductor portion and the support substrate by disposing the semiconductor portion on the first surface across the groove portion in a plan view; removing the substrate from the semiconductor portion; bonding a wavelength conversion member to the semiconductor portion from which the substrate has been removed; supplying a resin member having light reflectivity into the groove portion and a space between the support substrate and the wavelength conversion member; and exposing the resin member in the groove portion from the support substrate by removing part of the support substrate from the second surface side.

9 Claims, 17 Drawing Sheets

(56) References Cited

FOREIGN PATENT DOCUMENTS

| | | | |
|---|---|---|---|
| JP | 2018107258 | A | 7/2018 |
| WO | 2013187318 | A1 | 12/2013 |
| WO | 2016021476 | A1 | 2/2016 |
| WO | 2016129658 | A1 | 8/2016 |

* cited by examiner

METHOD FOR MANUFACTURING LIGHT-EMITTING DEVICE, AND LIGHT-EMITTING DEVICE

CROSS-REFERENCE TO RELATED APPLICATIONS

The present application claims priority under 35 U.S.C. § 119 to Japanese Patent Application No. 2022-096430, filed on Jun. 15, 2022, the contents of which are hereby incorporated by reference in their entirety.

BACKGROUND

An embodiment of the present invention relates to a method for manufacturing a light-emitting device, and the light-emitting device.

Japanese Patent Publication No. 2012-124443 discloses an LED device in which an electrode connected to a bump electrode of an LED element is provided on a bottom surface of a encapsulating member that covers a lateral surface of the LED element and a portion of the bottom surface where the bump electrode is not disposed, and discloses a method for manufacturing the LED device. The LED device is also provided with a phosphor layer that covers an upper surface of the LED element and an upper surface of the encapsulating member.

SUMMARY

The embodiment of the present invention provides a method for manufacturing a light-emitting device and the light-emitting device that can improve a yield.

A method for manufacturing a light-emitting device, according to one embodiment of the present invention, includes: providing a substrate on which a semiconductor portion is disposed;

- providing a support substrate having conductivity, including a first surface and a second surface on a side opposite to the first surface, and including a groove portion formed at the first surface;
- electrically connecting the semiconductor portion and the support substrate by disposing the semiconductor portion on the first surface across the groove portion in a plan view;
- removing the substrate from the semiconductor portion;
- bonding a wavelength conversion member to the semiconductor portion from which the substrate has been removed;
- supplying a resin member having light reflectivity into the groove portion and a space between the support substrate and the wavelength conversion member; and
- exposing the resin member in the groove portion from the support substrate by removing part of the support substrate from the second surface side.

A light-emitting device according to one embodiment of the present invention includes:

- a semiconductor portion including a first surface and a second surface on a side opposite to the first surface;
- a first electrode portion disposed on the first surface;
- a second electrode portion spaced apart from the first electrode portion on the first surface;
- a first support substrate having conductivity and being connected to the first electrode portion such that the first support substrate is partially overlapped with the first electrode portion in a plan view;
- a second support substrate having conductivity and being connected to the second electrode portion such that the second support substrate is partially overlapped with the second electrode portion in the plan view;
- a wavelength conversion member disposed on the second surface; and
- a resin member having light reflectivity disposed between the wavelength conversion member and the first support substrate, between the wavelength conversion member and the second support substrate, and between the first support substrate and the second support substrate.

An embodiment of the present invention can provide a method for manufacturing a light-emitting device and the light-emitting device that can improve a yield.

BRIEF DESCRIPTION OF DRAWINGS

A more complete appreciation of embodiments of the invention and many of the attendant advantages thereof will be readily obtained by reference to the following detailed description when considered in connection with the accompanying drawings.

DETAILED DESCRIPTION

Figure 1:
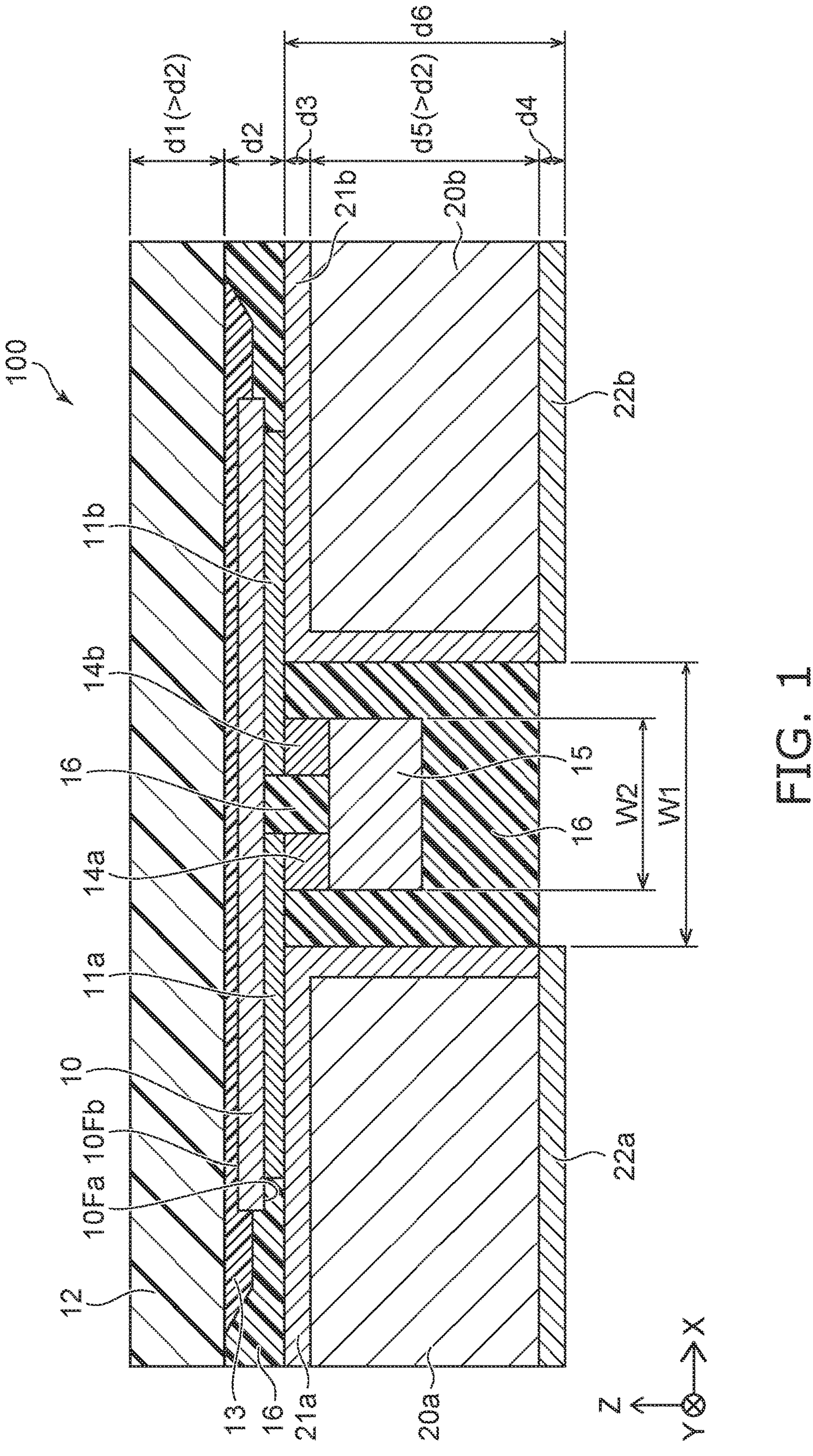
FIG. 1 is a schematic cross-sectional view illustrating an example of a light-emitting device according to an embodiment of the present disclosure.

An embodiment of the present invention will be described below with reference to the accompanying drawings.

The drawings are schematic or conceptual, and the relationships between thicknesses and widths of portions, the proportions of sizes between portions, and the like are not necessarily the same as the actual values thereof. The dimensions and the proportions may be illustrated differently between the drawings, even in a case in which the same portion is illustrated.

In the present specification and the drawings, elements similar to those described with reference to the drawing already mentioned are denoted using like reference signs, and a detailed description thereof is omitted as appropriate.

Figure 2:
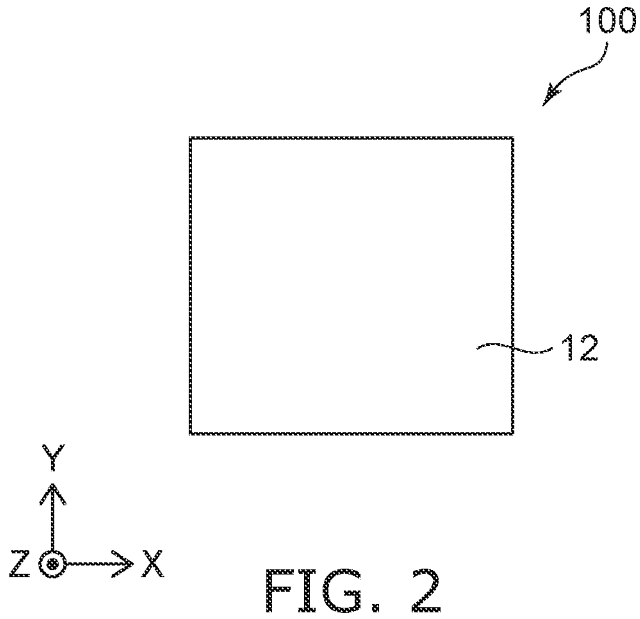
FIG. 2 is a schematic top view illustrating an example of the light-emitting device according to the embodiment.
Figure 3:
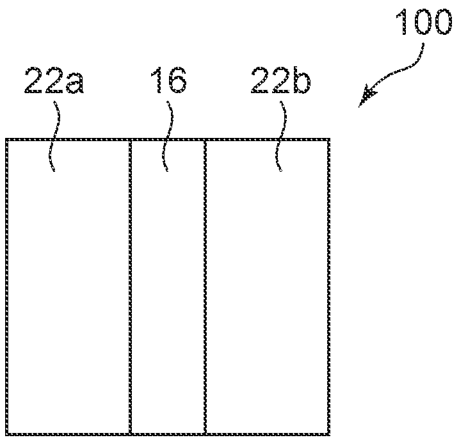
FIG. 3 is a schematic bottom view illustrating an example of the light-emitting device according to the embodiment.
Figure 3:
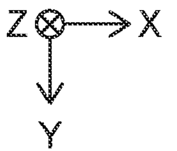

FIG. 1 is a schematic cross-sectional view illustrating an example of a light-emitting device 100. FIG. 2 is a schematic top view illustrating an example of the light-emitting device 100. FIG. 3 is a schematic bottom view illustrating an example of the light-emitting device 100. In the following description, a horizontal direction of the light-emitting device 100 in FIG. 1 may be referred to as an X-axis direction, a vertical direction thereof may be referred to as a Z-axis direction, and a direction orthogonal to the X-axis direction and the Z-axis direction may be referred to as a Y-axis direction.

As illustrated in FIG. 1, a semiconductor portion 10 has a first surface 10Fa and a second surface 10Fb on a side opposite to the first surface 10Fa. In the present embodiment, the first surface 10Fa is a lower surface, and the second surface 10Fb is an upper surface. The first surface 10Fa and the second surface 10Fb are each substantially parallel to the X-Y plane.

A first electrode portion 11*a* and a second electrode portion 11*b* are disposed on the first surface 10Fa of the semiconductor portion 10. The first electrode portion 11*a* and the second electrode portion 11*b* are spaced apart from each other in the X-axis direction. The first electrode portion 11*a* and the second electrode portion 11*b* are formed of a conductive material. For example, the conductive material is gold (Au), copper (Cu), or the like.

A wavelength conversion member 12 is disposed over the second surface 10Fb of the semiconductor portion 10. The wavelength conversion member 12 is, for example, a light-transmissive resin member containing a phosphor. The wavelength conversion member 12 absorbs part of light from the semiconductor portion 10, and emits light having a peak wavelength different from a peak wavelength of the light from the semiconductor portion 10. The wavelength conversion member 12 and the second surface 10Fb of the semiconductor portion 10 are bonded to each other by, for example, a bonding member 13. As the bonding member 13, for example, an epoxy resin, a silicone resin, or the like can be used. As illustrated in FIG. 2, a shape of the wavelength conversion member 12 is quadrangular in a plan view. When the wavelength conversion member 12 has a quadrangular shape, a length of one side can be, for example, in a range from 50 μm to 1500 μm. The size of an outer boundary of each element of the light-emitting device 100 that is disposed below the wavelength conversion member 12 is equal to or smaller than the size of an outer boundary of the wavelength conversion member 12 in the plan view. For example, a resin member 16, a first support substrate and a second support substrate 20*b*, which are elements of the light-emitting device 100, are disposed inside the outer boundary of the wavelength conversion member 12 in the plan view. In a cross-sectional view, a lateral surface of the wavelength conversion member 12, a lateral surface of the resin member 16, and a lateral surface of the first support substrate 20*a* are substantially flush with one another. Similarly, in the cross-sectional view, the lateral surface of the wavelength conversion member 12, the lateral surface of the resin member 16, and a lateral surface of the second support substrate 20*b* are substantially flush with one another.

A conductive portion 14*a* is disposed on a lower surface of the first electrode portion 11*a*. A conductive portion 14*b* is disposed on a lower surface of the second electrode portion 11*b*. The conductive portions 14*a* and 14*b* are members for electrically connecting a Zener diode 15 described later and the first electrode portion 11*a* and the second electrode portion 11*b*. A material of the first electrode portion 11*a*, the second electrode portion 11*b*, and the conductive portions 14*a* and 14*b* is a conductive metal. The conductive material is, for example, gold (Au), copper (Cu), or the like.

The first support substrate 20*a* is connected to the first electrode portion 11*a* so as to be partially overlapped by the first electrode portion 11*a* in the plan view. The second support substrate 20*b* is connected to the second electrode portion 11*b* so as to be partially overlapped by the second electrode portion 11*b* in the plan view. As a material of the first support substrate 20*a* and the second support substrate 20*b*, a conductive material is used. In the present embodiment, for example, silicon (Si) or the like is used. A material of the first support substrate 20*a* and the second support substrate 20*b* may be a metal. In the present embodiment, in the first support substrate an upper surface, a lower surface, and a lateral surface facing the second support substrate 20*b* are covered with a conductive material. Also in the second support substrate 20*b*, an upper surface, a lower surface, and a lateral surface facing the first support substrate 20*a* are covered with a conductive material.

A first conductive portion 21*a* and a second conductive portion 22*a* are disposed on the first support substrate 20*a*. The first conductive portion 21*a* is disposed on the upper surface and the lateral surface of the first support substrate 20*a* on the second support substrate 20*b* side. The second conductive portion 22*a* is disposed on the lower surface of the first support substrate 20*a*. A first conductive portion 21*b* and a second conductive portion 22*b* are disposed on the second support substrate 20*b*. The first conductive portion 21*b* is disposed on the upper surface and the lateral surface of the second support substrate 20*b* on the first support substrate 20*a* side. The second conductive portion 22*b* is disposed on the lower surface of the second support substrate End portions of the second conductive portions 22*a* and 22*b* are electrically connected to end portions of the first conductive portions 21*a* and 21*b*, respectively. As illustrated in FIG. 3, the resin member 16 described later is disposed between the second conductive portions 22*a* and 22*b*.

Part of the first conductive portion 21*a* is overlapped by the first electrode portion 11*a* in the plan view. Part of the first conductive portion 21*a* is disposed between the Zener diode 15 described later and the first support substrate 20*a* in the X-axis direction. Part of the first conductive portion 21*b* is overlapped by the second electrode portion 11*b* in the plan view. Part of the first conductive portion 21*b* is disposed between the Zener diode 15 described later and the second support substrate 20*b* in the X-axis direction. In the X-axis direction, a width W1 between the first conductive portion 21*a* and the first conductive portion 21*b* is, for example, in a range from 100 μm to 600 μm.

The light-emitting device 100 further includes the Zener diode 15 electrically connected to the first electrode portion 11*a* and the second electrode portion 11*b* on a side opposite to the semiconductor portion 10 from the first electrode portion 11*a* and the second electrode portion 11*b*. By disposing the Zener diode 15, the light-emitting device 100 can supply a stable voltage to the semiconductor portion 10. The Zener diode 15 is disposed in the resin member 16 between the first support substrate 20*a* and the second support substrate 20*b* in the X-axis direction. The first electrode portion 11*a* and the Zener diode 15 are electrically connected to each other by, for example, the conductive portion 14*a*. The second electrode portion 11*b* and the Zener diode 15 are electrically connected to each other by the conductive portion 14*b*.

A width W2 of the Zener diode 15 in the X-axis direction is smaller than the width W1 between the first conductive portion 21*a* and the first conductive portion 21*b*. The width W2 is, for example, in a range from 50 μm to 550 μm. In the Z-axis direction, a lower surface of the Zener diode 15 is located closer to the semiconductor portion 10 side than the lower surfaces of the first support substrate 20*a* and the second support substrate 20*b* are.

The resin member 16 is disposed between the wavelength conversion member 12 and the first support substrate 20*a*, between the wavelength conversion member 12 and the second support substrate 20*b*, and between the first support substrate 20*a* and the second support substrate 20*b*. The resin member 16 is further disposed around the Zener diode 15 and between the semiconductor portion 10 and the Zener diode 15. The resin member 16 is, for example, a light reflective resin. As the resin, for example, an epoxy resin, a silicone resin, or the like can be used. The resin member 16 may contain, for example, titanium oxide, silicon oxide, zirconium oxide, aluminum oxide, or the like as a light scattering material. The light from the semiconductor portion 10 toward the resin member 16 and the light from the wavelength conversion member 12 toward the resin member 16 are reflected by the resin member 16 toward the upper surface side of the wavelength conversion member 12.

A thickness d1 of the wavelength conversion member 12 in the Z-axis direction is larger than a thickness d2 of the resin member 16 in the Z-axis direction disposed between the wavelength conversion member 12 and the first support substrate 20*a*. That is, the thickness d1>the thickness d2. Note that a thickness of the resin member 16 in the Z-axis direction disposed between the wavelength conversion member 12 and the second support substrate 20*b* is also the thickness d2. The thickness d1 is, for example, in a range from 50 μm to 300 μm. The thickness d2 is, for example, in a range from 5 μm to 15 pin. A thickness d3 of the first conductive portions 21*a* and 21*b* in the Z-axis direction is smaller than the thickness d2. A thickness d4 of the second conductive portions 22*a* and 22*b* in the Z-axis direction is smaller than the thickness d2. That is, the thickness d3, d4<the thickness d2. The thickness d3 of the first conductive portions 21*a* and 21*b* and the thickness d4 of the second conductive portions 22*a* and 22*b* may be substantially the same. The thickness d3 is, for example, in a range from 0.5 μm to 5 μm. The thickness d4 is, for example, in a range from 0.5 μm to 5 μm. A thickness d5 of the first support substrate 20*a* and the second support substrate 20*b* in the Z-axis direction is larger than the thickness d3 and the thickness d4. That is, the thickness d5>the thickness d3, d4. The thickness d5 of the first support substrate 20*a* and the second support substrate 20*b* in the Z-axis direction is larger than the thickness d2 of the resin member 16 disposed between the wavelength conversion member 12 and the first support substrate 20*a*. The thickness d5 is, for example, in a range from 200 μm to 400 μm. In the Z-axis direction, a thickness d6 obtained by adding the thicknesses of the first conductive portion 21*a*, the first support substrate 20*a*, and the second conductive portion 22*a* is, for example, in a range from 200 μm to 400 μm. Also, in the Z-axis direction, a thickness obtained by adding the thicknesses of the second conductive portion 21*b*, the second support substrate 20*b*, and the second conductive portion 22*b* is also the thickness d6.

Figure 4:
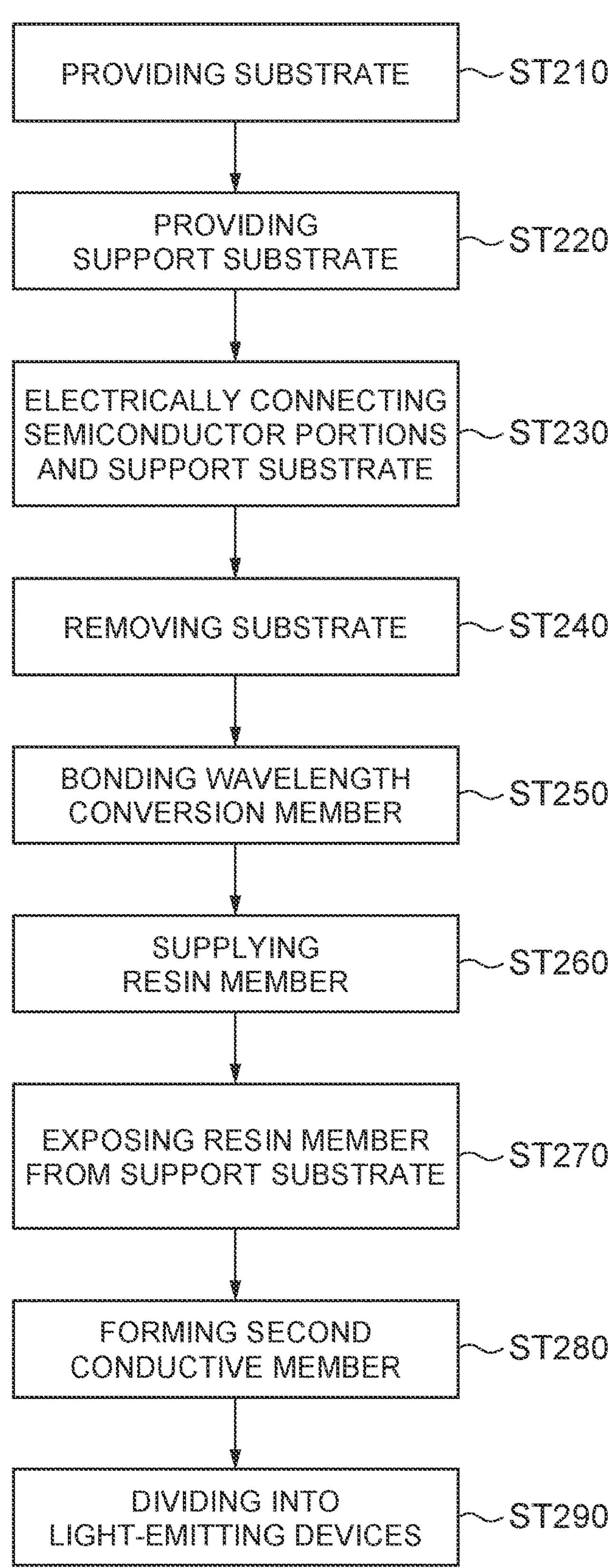
FIG. 4 is a flowchart showing an example of a method for manufacturing the light-emitting device according to the embodiment.

FIG. 4 is a flowchart showing an example of a method for manufacturing the light-emitting device 100. FIGS. 5, 7, 9, 10, 12, 14, 15, 16, and 17 are schematic cross-sectional views illustrating an example of the method for manufacturing the light-emitting device 100. FIGS. 6, 8, 11, 13, and 18 are schematic plan views illustrating an example of the method for manufacturing the light-emitting device corresponding to FIGS. 5, 7, 10, 12, and 17, respectively. The axial directions of the XYZ axes in FIGS. 5 to 18 indicate directions corresponding to the axial directions of the XYZ axes of the light-emitting device 100.

Figure 5:
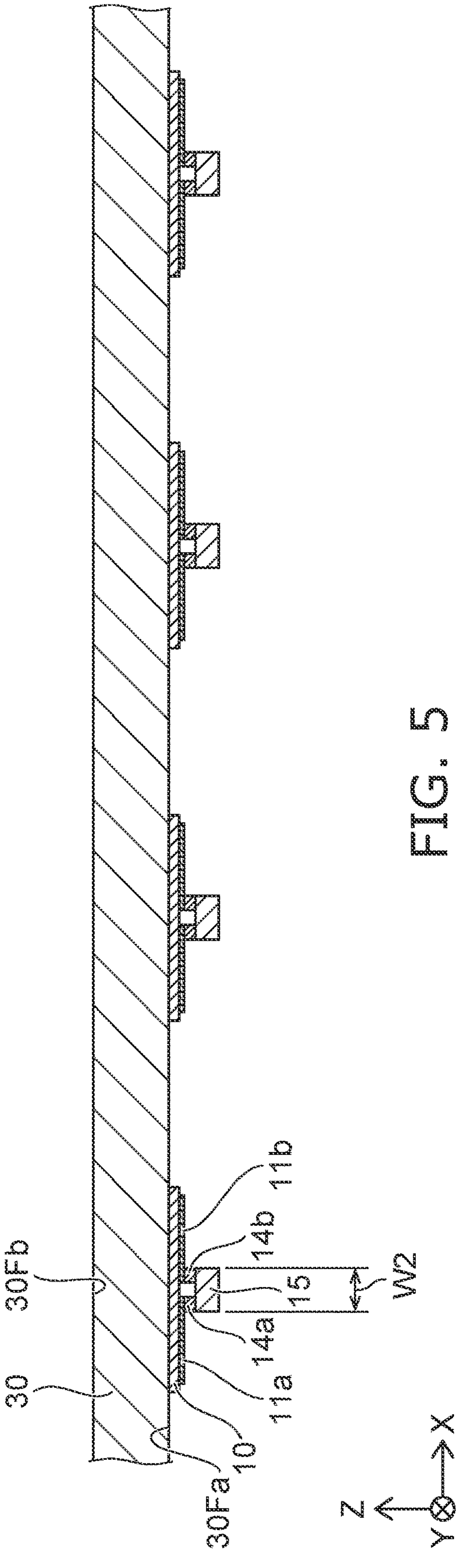
FIG. 5 is a schematic cross-sectional view illustrating an example of the method for manufacturing the light-emitting device according to the embodiment.
Figure 6:
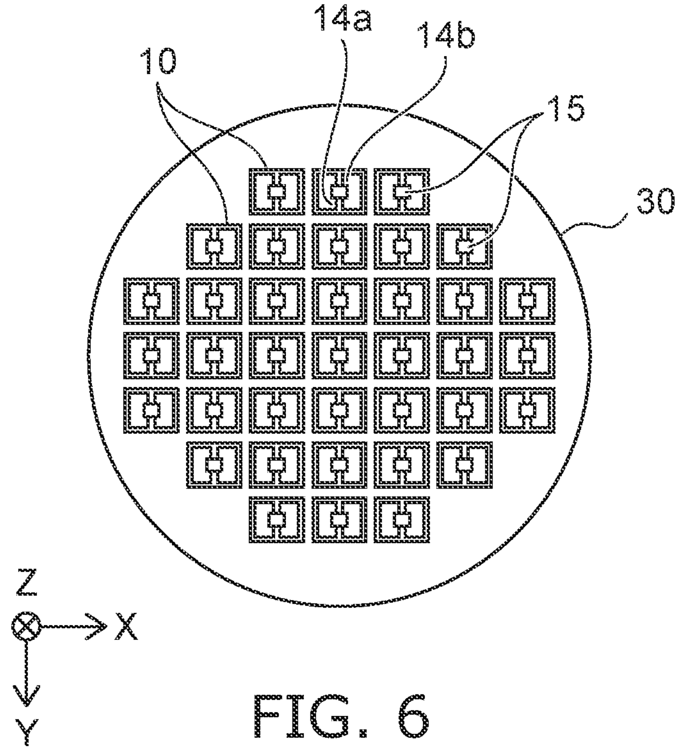
FIG. 6 is a schematic plan view illustrating an example of the method for manufacturing the light-emitting device according to the embodiment.

As illustrated in FIGS. 4, 5, and 6, a substrate 30 is provided (ST210). The substrate 30 has a first surface 30Fa being a lower surface in the Z-axis direction, and a second surface 30Fb being an upper surface in the Z-axis direction. A plurality of semiconductor portions 10 are disposed on the first surface 30Fa of the substrate 30. The plurality of semiconductor portions 10 are separately disposed on the first surface 30Fa of the substrate 30. The substrate 30 is, for example, a growth substrate used for growing the semiconductor portion 10. The substrate 30 is, for example, a sapphire substrate. The substrate 30 has a circular shape in the plan view. For example, as illustrated in FIG. 6, the plurality of semiconductor portions 10 are disposed in a matrix in the plan view on the first surface 30Fa of the substrate 30. The first electrode portion 11*a* and the second electrode portion 11*b* are disposed on a surface of each of the semiconductor portions 10 on a side opposite to the surface on the substrate 30 side. The first electrode portion 11*a* and the second electrode portion 11*b* are spaced apart from each other in the X-axis direction. The Zener diode 15 is disposed for each of the semiconductor portions 10. The first electrode portion 11*a* is electrically connected to the Zener diode 15 through the conductive portion 14*a*, and the second electrode portion 11*b* is electrically connected to the Zener diode 15 through the conductive portion 14*b*. The Zener diode 15 is disposed for the semiconductor portion 10 by flip chip bonding, for example.

Figure 7:
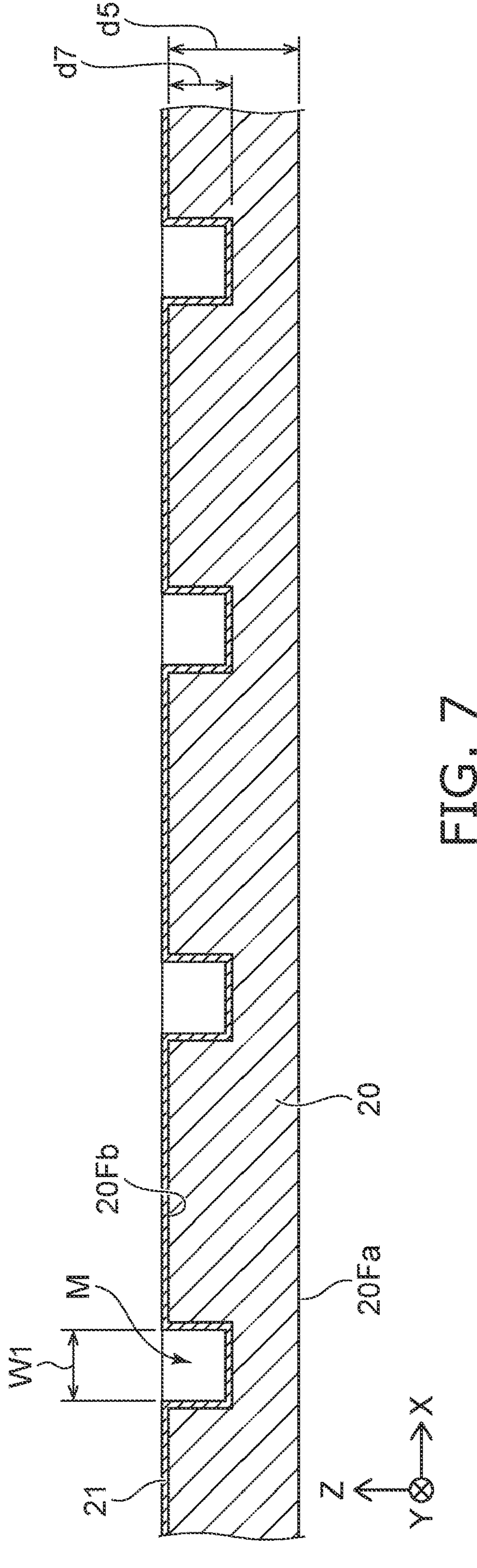
FIG. 7 is a schematic cross-sectional view illustrating an example of the method for manufacturing the light-emitting device according to the embodiment.
Figure 8:
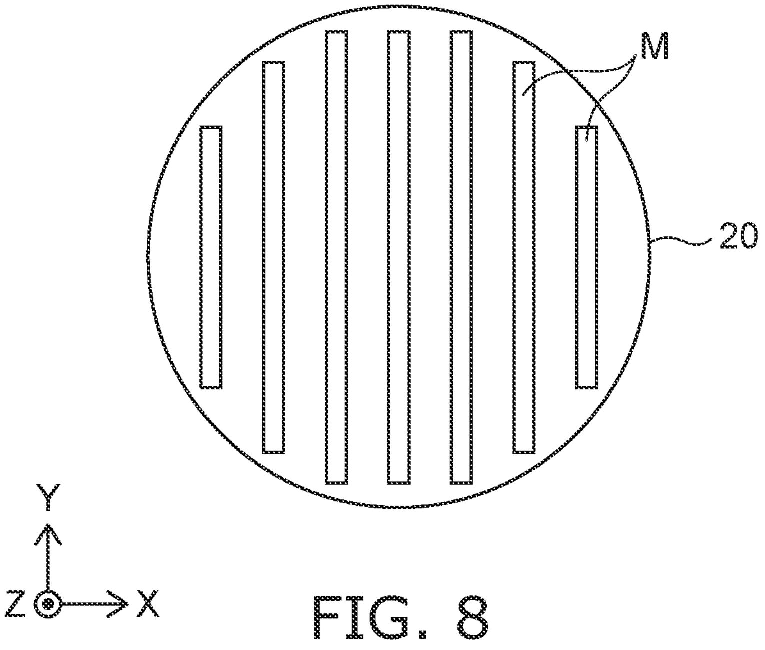
FIG. 8 is a schematic plan view illustrating an example of the method for manufacturing the light-emitting device according to the embodiment.

As illustrated in FIGS. 4, 7, and 8, a support substrate 20 is provided (ST220). The support substrate 20 is a conductive substrate including a first surface and a second surface 20Fa on a side opposite to the first surface 20Fb, and having a plurality of groove portions M formed at the first surface 20Fb. The support substrate has a circular shape in the plan view. The support substrate 20 is made of, for example, silicon. In the support substrate 20, for example, the plurality of groove portions M are formed. The groove portion M can be formed with a blade, by etching, or the like, for example.

The plurality of groove portions M are formed along a first direction, in the present embodiment, the Y-axis direction, at regular intervals. The groove portion M is connected to a space between the support substrate 20 and the wavelength conversion member 12. Although the groove portion M does not reach an outer edge of the support substrate 20 in FIG. 8, the groove portion M may be formed so as to reach the outer edge of the support substrate 20. A depth d7 of the groove portion M in the Z-axis direction is, for example, about half of the depth d5 of the support substrate 20 in the Z-axis direction. The depth d7 is, for example, in a range from 200 μm to 500 μm. In the X-axis direction, the width W1 of the groove portion M is larger than the width W2 of the Zener diode 15. When the substrate 30 and the support substrate 20 are bonded to each other, the plurality of groove portions M are disposed at intervals at which the Zener diode 15 provided for each of the semiconductor portions 10 can be accommodated in the corresponding groove portion M. A first conductive member 21 is formed on the first surface 20Fb of the support substrate 20 and an inner surface of the groove portion M. The first conductive member 21 can be formed by sputtering, vapor deposition, or the like, for example. A material of the first conductive member 21 is, for example, gold. Before the first conductive member 21 is formed, an oxide film formed on the first surface 20Fb may be removed by buffered hydrofluoric acid (BHF) or the like.

Figure 9:
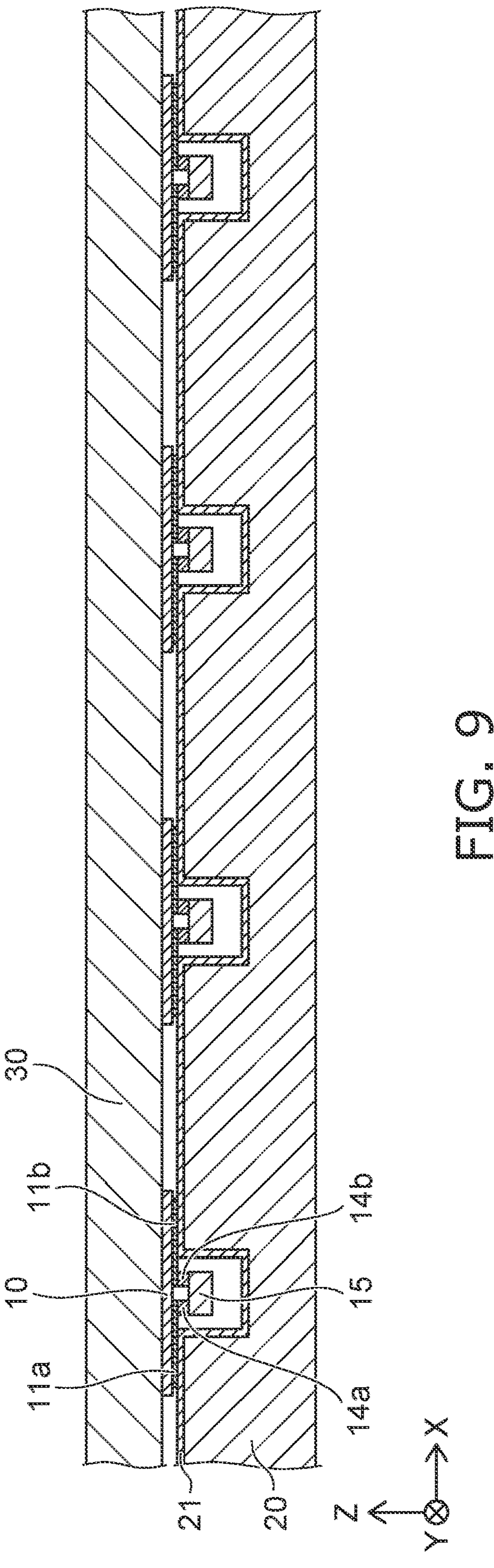
FIG. 9 is a schematic cross-sectional view illustrating an example of the method for manufacturing the light-emitting device according to the embodiment.

As illustrated in FIGS. 4 and 9, the plurality of semiconductor portions 10 and the support substrate 20 are electrically connected to each other (ST230). Specifically, the semiconductor portion 10 is disposed on the first surface 20Fb of the support substrate 20 across the groove portion M in the plan view, and the plurality of semiconductor portions 10 disposed on the substrate 30 and the support substrate 20 are electrically connected to each other. More specifically, the first conductive member 21 formed on the first surface 20Fb of the support substrate 20 is bonded to the first electrode portion 11*a* and the second electrode portion 11*b* of each of the semiconductor portions 10, and thus the semiconductor portions 10 and the support substrate 20 are electrically connected to each other. The plurality of semiconductor portions 10 and the support substrate 20 are connected to each other such that the Zener diode 15 for each of the plurality of semiconductor portions 10 arranged in the Y-axis direction is disposed in the corresponding one groove portion M.

Figure 10:
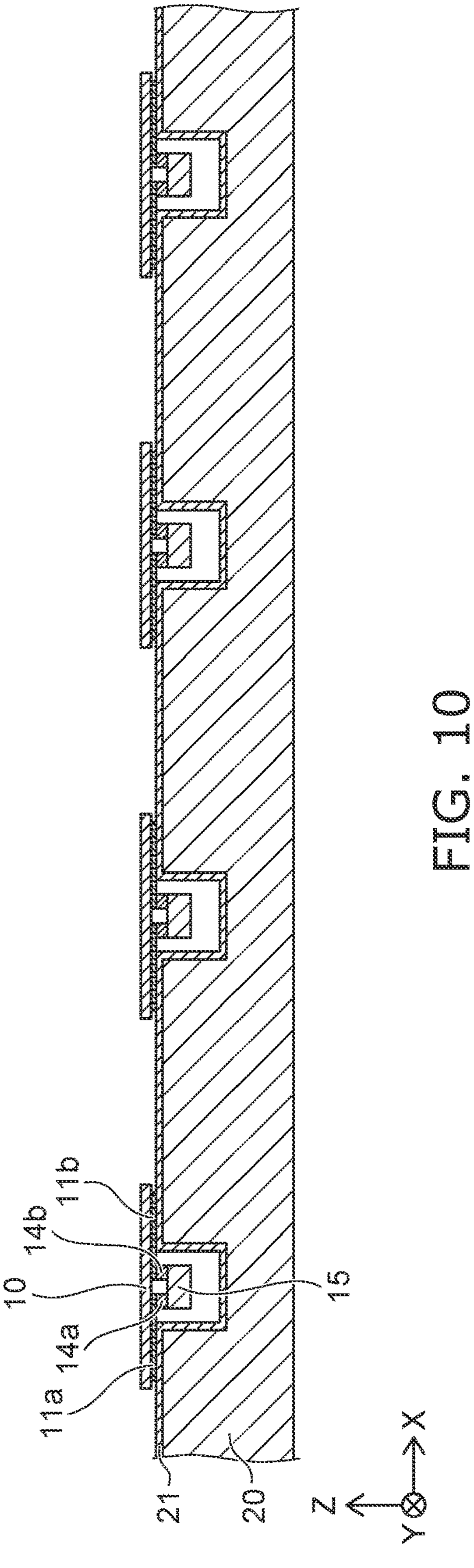
FIG. 10 is a schematic cross-sectional view illustrating an example of the method for manufacturing the light-emitting device according to the embodiment.
Figure 11:
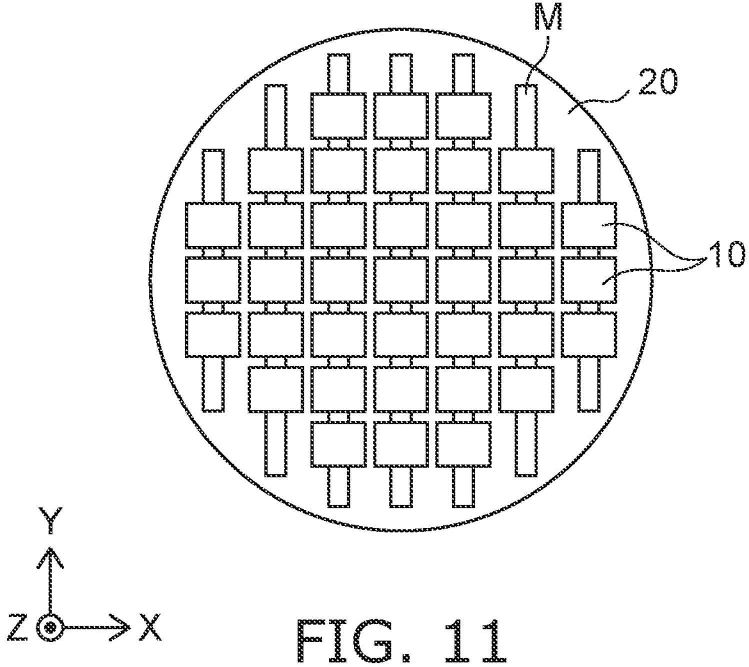
FIG. 11 is a schematic plan view illustrating an example of the method for manufacturing the light-emitting device according to the embodiment.

As illustrated in FIGS. 4, 10 and 11, the substrate 30 is removed (ST240). The substrate 30 is removed from the plurality of semiconductor portions 10, and the upper surfaces of the plurality of semiconductor portions 10 are exposed.

Figure 12:
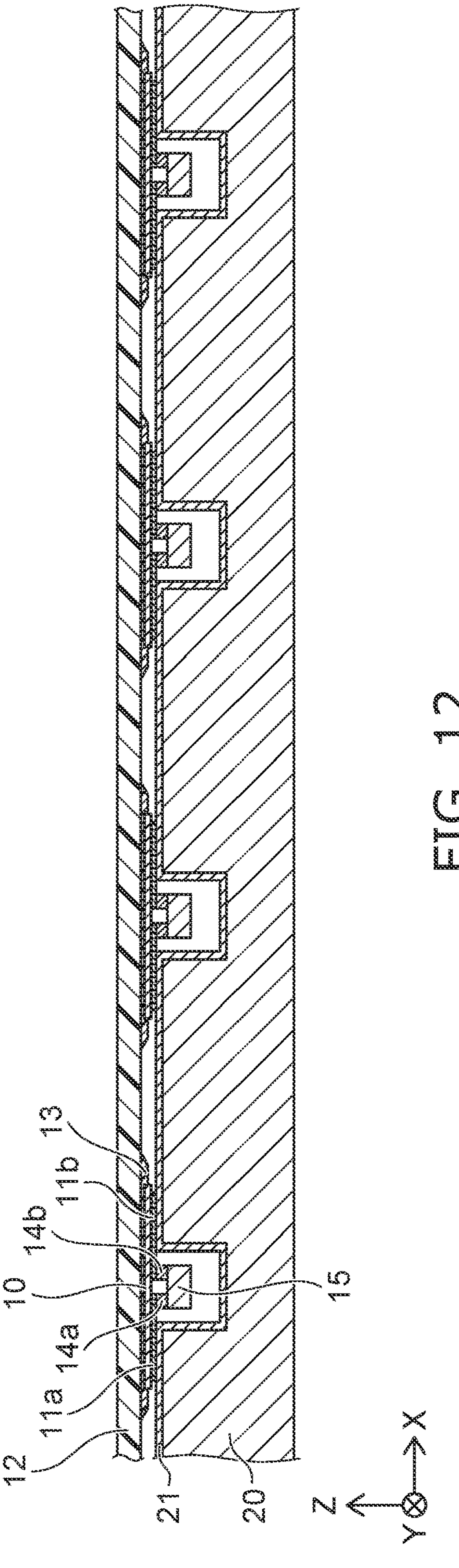
FIG. 12 is a schematic cross-sectional view illustrating an example of the method for manufacturing the light-emitting device according to the embodiment.
Figure 13:
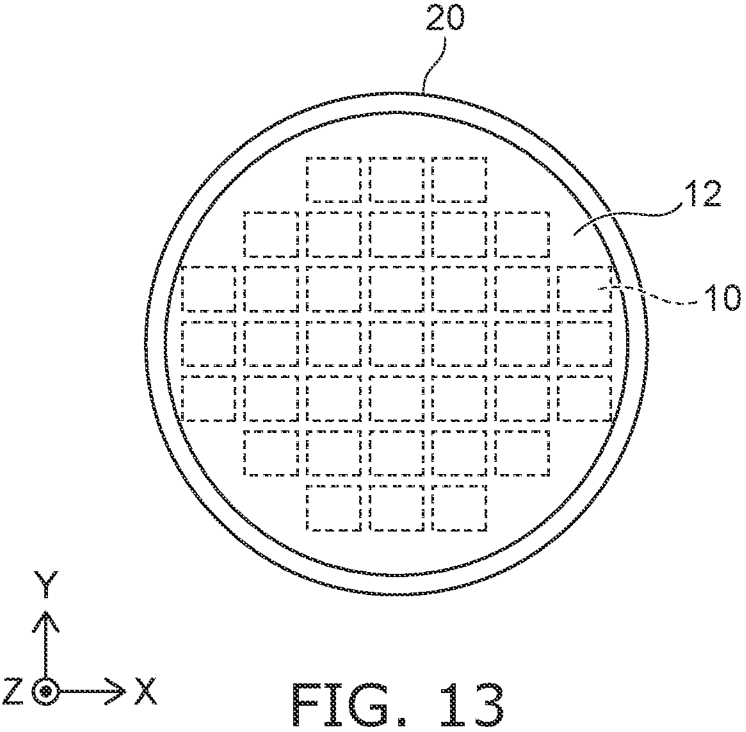
FIG. 13 is a schematic plan view illustrating an example of the method for manufacturing the light-emitting device according to the embodiment.

As illustrated in FIGS. 4, 12, and 13, the wavelength conversion member 12 is bonded (ST250). The wavelength conversion member 12 is bonded onto the plurality of semiconductor portions 10 from which the substrate 30 is removed. The wavelength conversion member 12 has a circular shape in the plan view. The outer boundary of the wavelength conversion member 12 is smaller than an outer boundary of the support substrate 20, but covers at least all of the upper surfaces of the plurality of semiconductor portions 10. For example, the wavelength conversion member 12 is bonded to the upper surfaces of the plurality of semiconductor portions 10 by the bonding member 13.

Figure 14:
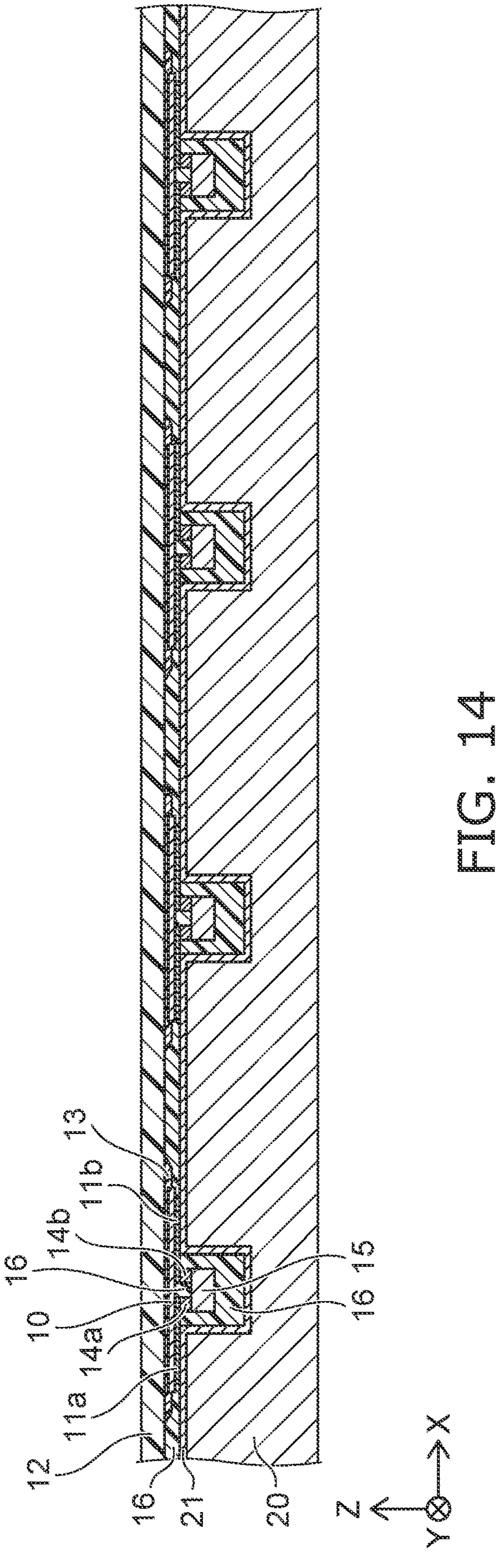
FIG. 14 is a schematic cross-sectional view illustrating an example of the method for manufacturing the light-emitting device according to the embodiment.

As illustrated in FIGS. 4 and 14, the resin member 16 is supplied (ST260). The resin member 16 is supplied to the groove portion M and a space between the support substrate 20 and the wavelength conversion member 12. For example, supplying the resin member 16 is performed from the space between the support substrate 20 and the wavelength conversion member 12 and from the groove portion M in the plan view. In this way, the resin member 16 is supplied to the plurality of groove portions M, and the space between the support substrate 20 and the wavelength conversion member 12 through the plurality of groove portions M. The resin member 16 having the thickness d2 smaller than the thickness d1 of the wavelength conversion member 12 is formed between the support substrate 20 and the wavelength conversion member 12.

Figure 15:
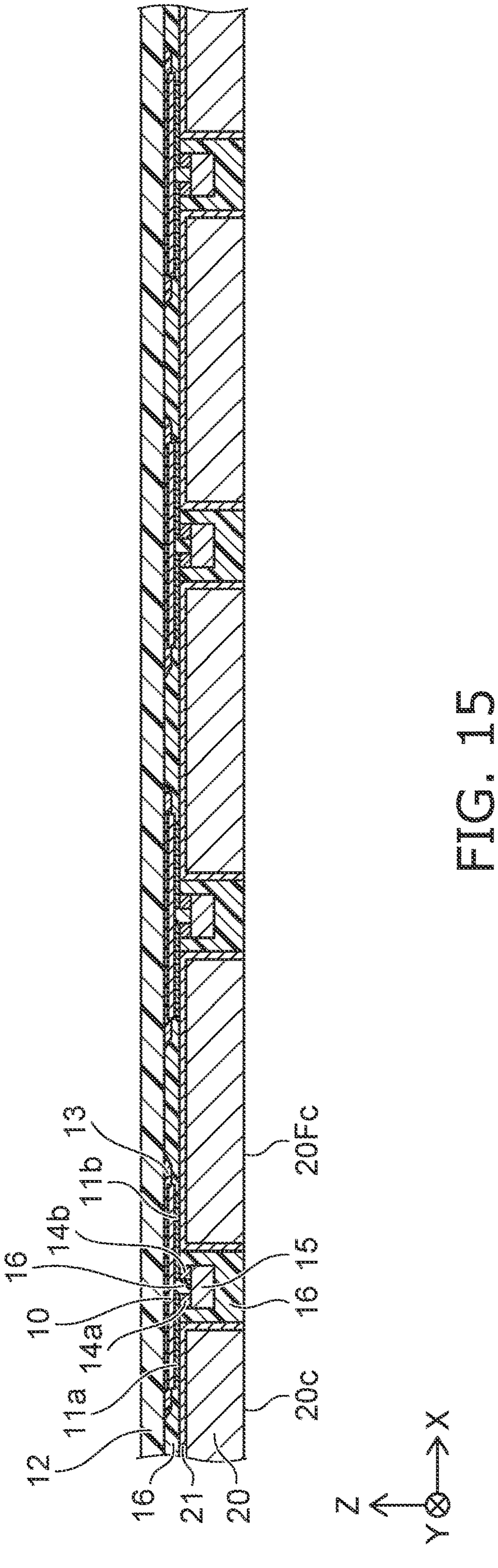
FIG. 15 is a schematic cross-sectional view illustrating an example of the method for manufacturing the light-emitting device according to the embodiment.

As illustrated in FIGS. 4 and 15, the resin member 16 is exposed from the support substrate 20 (ST270). More specifically, part of the support substrate 20 is removed from the second surface 20Fa side to expose the resin member 16 supplied in the groove portion M from the support substrate 20. For example, the support substrate 20 is ground from the second surface 20Fa side of the support substrate 20 until the resin member 16 supplied in the groove portion M is exposed. A surface opposite to the first surface 20Fb of the support substrate 20 formed by removing part of the support substrate 20 in such a manner is referred to as a third surface 20Fc.

Figure 16:
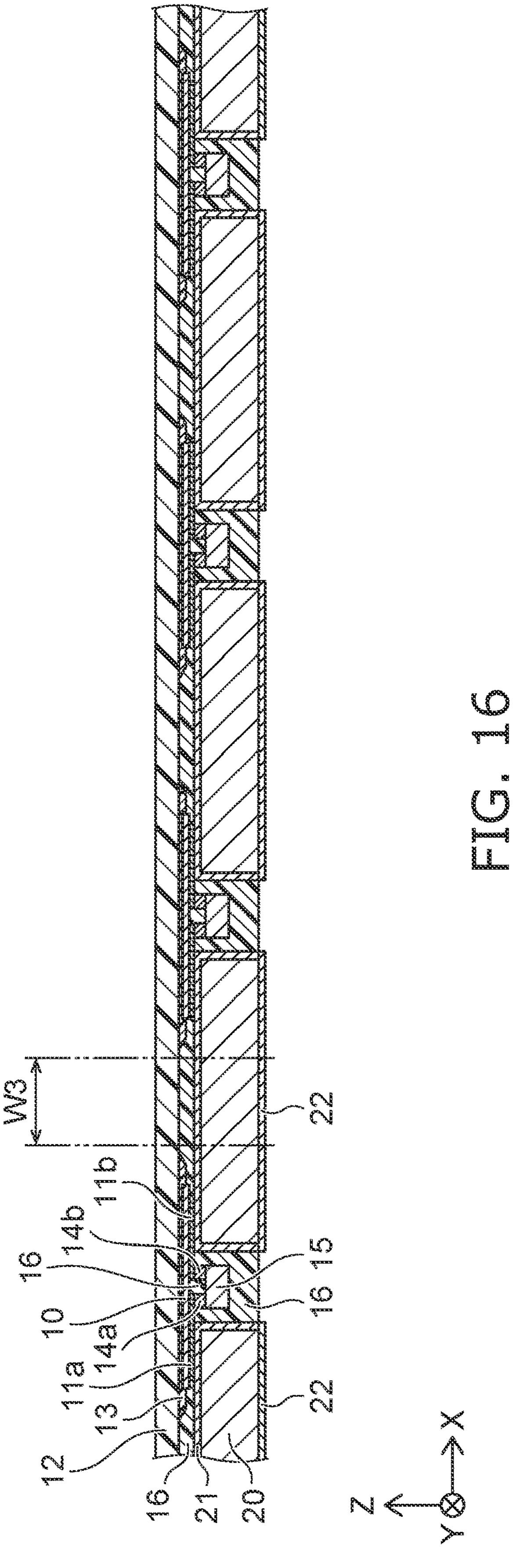
FIG. 16 is a schematic cross-sectional view illustrating an example of the method for manufacturing the light-emitting device according to the embodiment.

As illustrated in FIGS. 4 and 16, a second conductive member 22 is formed (ST280). The second conductive member 22 is formed on the third surface 20Fc of the support substrate 20 so as to be electrically connected to at least an end portion of the first conductive member 21. For example, the second conductive member 22 is formed on the third surface 20Fc of the support substrate 20 and is not formed on the resin member 16. Before the second conductive member 22 is formed, an oxide film formed on the third surface 20Fc may be removed by buffered hydrofluoric acid (BHF) or the like.

Figure 17:
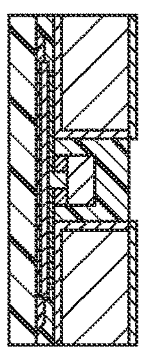
FIG. 17 is a schematic cross-sectional view illustrating an example of the method for manufacturing the light-emitting device according to the embodiment.
Figure 17:
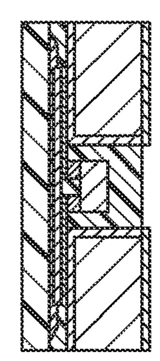
Figure 17:
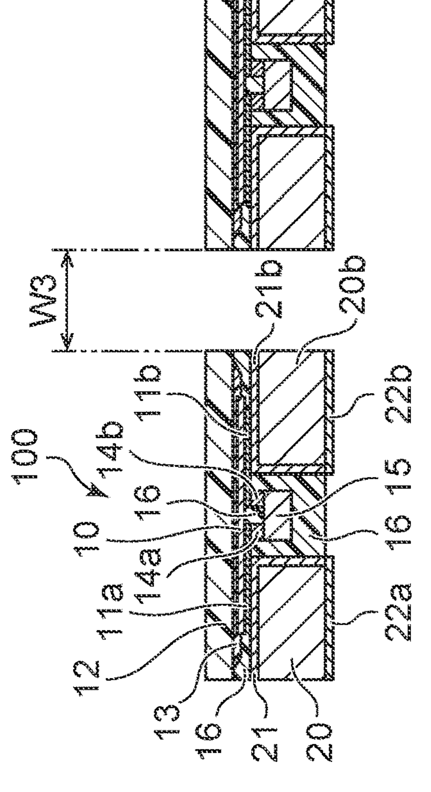
Figure 17:
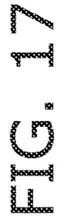
Figure 18:
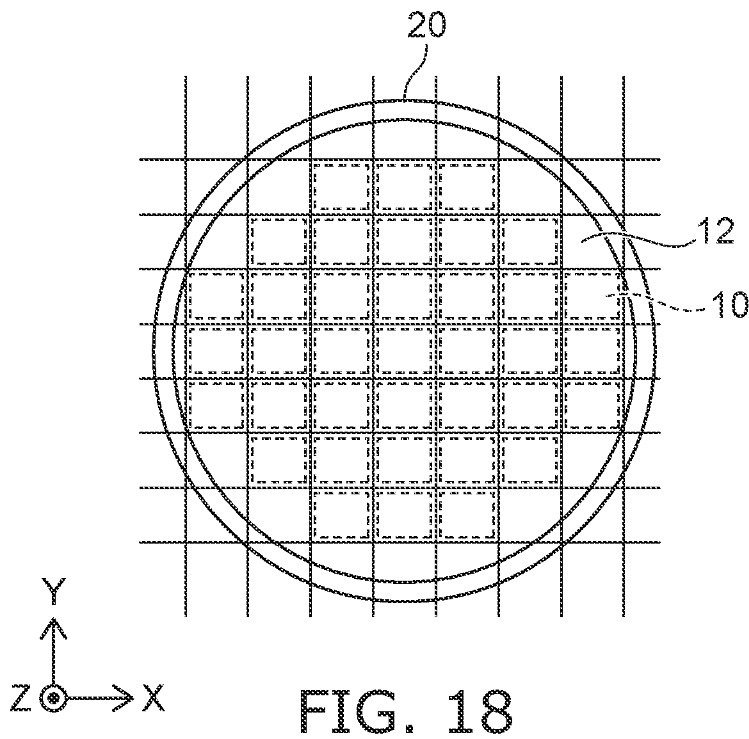
FIG. 18 is a schematic plan view illustrating an example of the method for manufacturing the light-emitting device according to the embodiment.

As illustrated in FIGS. 4, 17, and 18, division into the plurality of light-emitting devices 100 is performed (ST290). More specifically, the wavelength conversion member 12, the resin member 16, the support substrate 20, the first conductive member 21, and the second conductive member 22 that are located between the semiconductor portions 10 in the plan view are removed for division into the plurality of light-emitting devices 100. For example, as indicated by solid lines in FIG. 18, dicing is performed in the X-axis direction and the Y-axis direction at the width W3 between the semiconductor portions 10 to remove the wavelength conversion member 12, the resin member 16, the support substrate 20, the first conductive member 21, and the second conductive member 22 that correspond to the width W3, whereby the plurality of separated light-emitting devices 100 are obtained. In this way, the first support substrate 20*a* and the second support substrate 20*b* are formed from the support substrate 20, the first conductive portions 21*a* and 21*b* are formed from the first conductive member 21, and the second conductive portions 22*a* and 22*b* are formed from the second conductive member 22. Further, the division is performed such that the size of the outer boundary of each of the elements such as the resin member 16 and the support substrate 20 in the plan view is equal to or smaller than the size of the outer boundary of the wavelength conversion member 12. In this way, the light-emitting device 100 illustrated in FIG. 1 is manufactured.

As described above, according to the method for manufacturing the light-emitting device 100, in a state in which the wavelength conversion member 12 is bonded onto the plurality of semiconductor portions 10, supplying the resin member 16 can be performed, and the resin member 16 can be disposed between the support substrate 20 and the wavelength conversion member 12. Thus, the number of manufacturing steps can be reduced as compared to a case in which the plurality of semiconductor portions 10 are obtained by division by dicing, the resin member 16 is formed, and then the wavelength conversion member 12 is bonded to each of the semiconductor portions 10. Therefore, a decrease in yield due to an increase in the number of manufacturing steps can be suppressed, and the yield of the light-emitting device 100 can be improved.

Further, as illustrated in FIG. 16, while the wavelength conversion member 12, the resin member 16, the first conductive member 21, the support substrate 20, and the second conductive member 22 are layered in the Z-axis direction, the portion of the width W3 is removed by dicing. In this case, a thickness of the wavelength conversion member 12 is the thickness d1, and a total thickness of the first conductive portion 21*a*, the support substrate 20, and the second conductive member 22 is the thickness d6. Meanwhile, a thickness of the resin member 16 is the thickness d2. The thickness d2 is smaller than the thickness d1 and the thickness d6. The thickness d2 is, for example, a thickness in a range from 5% to 10% of the thickness d1 or the thickness d6. Thus, even when the resin member 16 has elasticity, an influence of elasticity during dicing can be reduced, and the portion of the width W3 can be efficiently removed. Therefore, the yield of the light-emitting device 100 can be improved.

Furthermore, in the present embodiment, after the substrate 30 is removed from the plurality of semiconductor portions 10, the wavelength conversion member 12 is bonded to the upper surfaces of the semiconductor portions 10 by the bonding member 13, and a thickness between the support substrate 20 and the wavelength conversion member 12 is the thickness d2. The thickness d2 is smaller than the depth d7 of the groove portion M. Therefore, for example, when the resin member 16 is supplied from the space between the support substrate 20 and the wavelength conversion member 12 and from both end portions of the plurality of groove portions M, the resin member 16 is supplied into, from the groove portions M, the space between the support substrate 20 and the wavelength conversion member 12 by a so-called capillary phenomenon. In this way, the light-emitting device 100 in which the resin member 16 is disposed between the support substrate 20 and the wavelength conversion member 12 can be efficiently manufactured as compared to a case in which the resin member 16 is formed between the support substrate 20 and the wavelength conversion member 12 after the plurality of semiconductor portions 10 are obtained by division by dicing and the resin member 16 is formed.

Further, in the light-emitting device 100, the size of the outer boundary of each element disposed below the wavelength conversion member 12 is equal to or smaller than the size of the outer boundary of the wavelength conversion member 12 in the plan view. Thus, when the plurality of light-emitting devices 100 are disposed side by side, a distance between the wavelength conversion members 12 of the adjacent light-emitting devices 100 can be reduced.

Furthermore, in the light-emitting device 100, the first support substrate 20*a* is covered with the first conductive portion 21*a* and the second conductive portion 22*a*, and the second support substrate 20*b* is covered with the first conductive portion 21*b* and the second conductive portion 22*b*. Thus, in the semiconductor portion 10, the current can pass through the conductive portions 21*a*, 21*b*, 22*a*, and 22*b* in the Z-axis direction. For this reason, the light-emitting device 100 can have an improved conductivity in the Z-axis direction as compared to a light-emitting device in which the current passes in the Z-axis direction only by the first support substrate 20*a* and the second support substrate 20*b*.

In the embodiment described above, the configuration in which the conductivity in the Z-axis direction is improved by the first conductive portion 21*a*, the second conductive portion 21*b*, the first conductive portion 21*b*, and the second conductive portion 22*b* has been described, but the configuration is not limited thereto. For example, since the first support substrate 20*a* and the second support substrate 20*b* are formed of a conductive material, the conductivity in the Z-axis direction can also be ensured in a light-emitting device that does not include the first conductive portion 21*a*, the second conductive portion 22*a*, the first conductive portion 21*b*, and the second conductive portion 22*b*. Further, in the embodiment described above, the configuration in which the plurality of semiconductor portions 10 are disposed on the substrate 30 has been described, but a configuration in which one semiconductor portion 10 is disposed on the substrate 30 may be employed.

The Embodiments of the present invention include Note 1 to Note 14 described below.

(Note 1)

A method for manufacturing a light-emitting device, including:

providing a substrate on which a semiconductor portion is disposed;

providing a support substrate having conductivity, including a first surface and a second surface on a side opposite to the first surface, and including a groove portion formed at the first surface;

electrically connecting the semiconductor portion and the support substrate by disposing the semiconductor portion on the first surface across the groove portion in a plan view;

removing the substrate from the semiconductor portion;

bonding a wavelength conversion member to the semiconductor portion from which the substrate has been removed;

supplying a resin member having light reflectivity into the groove portion and a space between the support substrate and the wavelength conversion member; and exposing the resin member in the groove portion from the support substrate by removing part of the support substrate from the second surface side.

(Note 2)

The method for manufacturing a light-emitting device, according to supplementary note 1, wherein the light-emitting device includes a plurality of the semiconductor portions disposed on the substrate, and the method further includes, after the exposing the resin member from the support substrate, removing the wavelength conversion member, the resin member, and the support substrate that are located between the semiconductor portions in the plan view, and dividing into a plurality of light-emitting devices.

(Note 3)

The method for manufacturing a light-emitting device, according to supplementary note 1 or 2, wherein the light-emitting device includes a plurality of the semiconductor portions disposed on the substrate, the light-emitting device further comprises:

a first electrode portion and a second electrode portion spaced apart from the first electrode portion provided for at least one of the semiconductor portions, and a Zener diode electrically connected to the first electrode portion and the second electrode portion of the corresponding semiconductor portion, wherein in the electrically connecting the semiconductor portion and the support substrate, the Zener diode is disposed in the groove portion.

(Note 4)

The method for manufacturing a light-emitting device, according to supplementary note 3, wherein the light-emitting device includes a plurality of the Zener diodes, in the providing the support substrate, a plurality of the groove portions and at least one additional groove portion are formed along a first direction on the support substrate, and in the electrically connecting the semiconductor portion and the support substrate, the semiconductor portions and the support substrate are connected to each other such that the Zener diodes provided for one or more of the semiconductor portions are respectively disposed in a corresponding one of the groove portions.

(Note 5)

The method for manufacturing a light-emitting device, according to any one of supplementary notes 1 to 4, wherein the groove portion and the space between the support substrate and the wavelength conversion member are connected with each other, and in the supplying the resin member, supplying the resin member in the groove portion and the space between the support substrate and the wavelength conversion member is supplied through the groove portion.

(Note 6)

The method for manufacturing a light-emitting device, according to any one of supplementary notes 1 to 5, wherein in the dividing into the plurality of light-emitting devices, the dividing is performed such that a size of an outer boundary of each of the resin member and the support substrate is equal to or smaller than a size of an outer boundary of the wavelength conversion member in the plan view.

(Note 7)

The method for manufacturing a light-emitting device, according to any one of supplementary notes 1 to 6, wherein in the providing the support substrate, the support substrate provided with a first conductive member on the first surface and an inner surface of the groove portion is provided.

(Note 8)

The method for manufacturing a light-emitting device, according to supplementary note 7, further including, after the exposing the resin member, forming a second conductive member on a third surface of the support substrate such that the second conductive member is electrically connected to the first conductive member, the third surface formed on a side opposite to the first surface by removing the part of the support substrate.

(Note 9)

The method for manufacturing a light-emitting device, according to any one of supplementary notes 1 to 8, wherein in the supplying the resin member, the resin member thinner than a thickness of the wavelength conversion member is formed between the support substrate and the wavelength conversion member.

(Note 10)

A light-emitting device including:

a semiconductor portion including a first surface and a second surface on a side opposite to the first surface;

a first electrode portion disposed on the first surface;

a second electrode portion spaced apart from the first electrode portion on the first surface;

a first support substrate having conductivity and being connected to the first electrode portion such that the first support substrate is partially overlapped with the first electrode portion in a plan view;

a second support substrate having conductivity and being connected to the second electrode portion such that the second support substrate is partially overlapped with the second electrode portion in the plan view;

a wavelength conversion member disposed on the second surface; and a resin member having light reflectivity disposed between the wavelength conversion member and the first support substrate, between the wavelength conversion member and the second support substrate, and between the first support substrate and the second support substrate.

(Note 11)

The light-emitting device according to supplementary note 10, wherein a thickness of the wavelength conversion member is larger than a thickness of the resin member disposed between the wavelength conversion member and the first support substrate.

(Note 12)

The light-emitting device according to supplementary note 10 or 11, wherein a thickness of each of the first support substrate and the second support substrate is larger than a thickness of the resin member disposed between the wavelength conversion member and the first support substrate.

(Note 13)

The light-emitting device according to any one of supplementary notes 10 to 12, further including a Zener diode electrically connected to the first electrode portion and the second electrode portion on a side opposite to the semiconductor portion side, wherein the Zener diode is disposed in the resin member between the first support substrate and the second support substrate.

(Note 14)

The light-emitting device according to any one of supplementary notes 10 to 13, wherein the resin member, the first support substrate, and the second support substrate are disposed inside an outer boundary of the wavelength conversion member in the plan view.

The invention claimed is:

1. A method for manufacturing a light-emitting device, comprising:

providing a substrate on which a semiconductor portion is disposed;

providing a support substrate having conductivity, including a first surface and a second surface located opposite to the first surface, and including a groove portion formed at the first surface;

electrically connecting the semiconductor portion and the support substrate by disposing the semiconductor portion on the first surface across the groove portion in a plan view;

removing the substrate from the semiconductor portion;

bonding a wavelength conversion member to the semiconductor portion from which the substrate has been removed;

supplying a resin member having light reflectivity into the groove portion and a space between the support substrate and the wavelength conversion member; and exposing the resin member in the groove portion from the support substrate by removing part of the support substrate from the second surface side.

2. The method for manufacturing a light-emitting device, according to claim 1, wherein the light-emitting device includes a plurality of the semiconductor portions disposed on the substrate, and the method further includes, after the exposing the resin member from the support substrate, removing the wavelength conversion member, the resin member, and the support substrate that are located between the semiconductor portions in the plan view, and dividing into a plurality of light-emitting devices.

3. The method for manufacturing a light-emitting device, according to claim 1, wherein the light-emitting device includes a plurality of the semiconductor portions disposed on the substrate, the light-emitting device further comprises:

a first electrode portion and a second electrode portion spaced apart from the first electrode portion provided for at least one of the semiconductor portions, and a Zener diode electrically connected to the first electrode portion and the second electrode portion of the corresponding semiconductor portion, wherein in the electrically connecting the semiconductor portion and the support substrate, the Zener diode is disposed in the groove portion.

4. The method for manufacturing a light-emitting device, according to claim 3, wherein, the light-emitting device includes a plurality of the Zener diodes, in the providing the support substrate, a plurality of the groove portions are formed along a first direction on the support substrate, and in the electrically connecting the semiconductor portion and the support substrate, the semiconductor portions and the support substrate are connected to each other such that the Zener diodes provided for one or more of the semiconductor portions are respectively disposed in a corresponding one of the groove portions.

5. The method for manufacturing a light-emitting device, according to claim 1, wherein the groove portion and the space between the support substrate and the wavelength conversion member are connected with each other, and in the supplying the resin member, the resin member in the groove portion and the space between the support substrate and the wavelength conversion member is supplied through the groove portion.

6. The method for manufacturing a light-emitting device, according to claim 2, wherein in the dividing into the plurality of light-emitting devices, the dividing is performed such that a size of an outer boundary of each of the resin member and the support substrate is equal to or smaller than a size of an outer boundary of the wavelength conversion member in the plan view.

7. The method for manufacturing a light-emitting device, according to claim 1, wherein in the providing the support substrate, the support substrate provided with a first conductive member on the first surface and an inner surface of the groove portion is provided.

8. The method for manufacturing a light-emitting device, according to claim 7, further comprising:

after the exposing the resin member, forming a second conductive member on a third surface of the support substrate such that the second conductive member is electrically connected to the first conductive member, the third surface opposite to the first surface and formed by removing the part of the support substrate.

9. The method for manufacturing a light-emitting device, according to claim 1, wherein in the supplying the resin member, the resin member thinner than a thickness of the wavelength conversion member is formed between the support substrate and the wavelength conversion member.

* * * * *